United States Patent
Rohleder et al.

(10) Patent No.: US 9,419,621 B1
(45) Date of Patent: Aug. 16, 2016

(54) SYSTEM ON CHIP AND METHOD OF OPERATING A SYSTEM ON CHIP

(71) Applicant: FREESCALE SEMICONDUCTOR, INC., Austin, TX (US)

(72) Inventors: Michael Rohleder, Unterschleissheim (DE); Mircea Ionita, Bucharest (RO); Michael Andreas Staudenmaier, Munich (DE)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/945,690

(22) Filed: Nov. 19, 2015

(30) Foreign Application Priority Data

Sep. 18, 2015 (RO) ............................. A 2015 00671

(51) Int. Cl.
*H03K 19/177* (2006.01)
*G06F 11/36* (2006.01)
(52) U.S. Cl.
CPC .... *H03K 19/17744* (2013.01); *H03K 19/17732* (2013.01); *G06F 11/3648* (2013.01)
(58) Field of Classification Search
None
See application file for complete search history.

(56) References Cited

U.S. PATENT DOCUMENTS

| | | | | |
|---|---|---|---|---|
| 5,142,677 A * | 8/1992 | Ehlig | ............. | G01R 31/318536 710/260 |
| 5,287,511 A * | 2/1994 | Robinson | ............ | G06F 17/5045 712/E9.03 |
| 5,324,916 A * | 6/1994 | Goto | ..................... | H01L 23/345 219/210 |
| 5,329,471 A * | 7/1994 | Swoboda | ....... | G01R 31/318536 703/13 |
| 5,487,173 A * | 1/1996 | Greiss | ............... | G06F 96/30167 710/5 |
| 5,535,331 A * | 7/1996 | Swoboda | .............. | G06F 15/786 712/E9.016 |
| 5,617,574 A * | 4/1997 | Boutaud | ........ | G01R 31/318536 712/200 |
| 5,768,575 A * | 6/1998 | McFarland | .......... | G06F 9/30003 712/209 |
| 5,781,753 A * | 7/1998 | McFarland | .......... | G06F 9/30003 712/209 |
| 5,805,792 A * | 9/1998 | Swoboda | ....... | G01R 31/318536 714/25 |
| 5,819,023 A | 10/1998 | Klingler | | |
| 5,978,937 A | 11/1999 | Miyamori et al. | | |
| 6,092,219 A * | 7/2000 | Porterfield | ....... | G01R 31/31705 710/100 |
| 6,158,023 A | 12/2000 | Ubukata et al. | | |
| 6,173,386 B1 * | 1/2001 | Key | .................... | G06F 11/3648 712/10 |
| 6,668,339 B1 | 12/2003 | Maeda | | |
| 6,704,895 B1 * | 3/2004 | Swoboda | ....... | G01R 31/318536 714/30 |
| 6,751,751 B1 | 6/2004 | Murray et al. | | |
| 6,781,408 B1 * | 8/2004 | Langhammer | ... | H03K 19/17732 326/38 |
| 6,864,710 B1 * | 3/2005 | Lacey | .............. | H03K 19/17728 326/39 |
| 6,920,586 B1 | 7/2005 | Moyer | | |
| 6,996,758 B1 * | 2/2006 | Herron | ............. | G01R 31/31717 714/726 |
| 7,138,824 B1 * | 11/2006 | Bakker | ............ | H03K 19/17732 326/32 |

(Continued)

FOREIGN PATENT DOCUMENTS

CN 102193860 A 9/2011

*Primary Examiner* — Crystal L Hammond

(57) ABSTRACT

The present application describes a SoC device with observer units for monitoring a state of a respective functional unit of the SoC combiner units for generating combinational events based on one or more observer events issued by the observer units and one or more feedback events from issued by action units and action units for generating feedback events and/or action request based the on at least one combinational event.

20 Claims, 7 Drawing Sheets

(56) References Cited

U.S. PATENT DOCUMENTS

| | | | |
|---|---|---|---|
| 7,334,161 B2 | 2/2008 | Williams et al. | |
| 7,546,186 B2* | 6/2009 | Yang | B60K 6/387 |
| | | | 477/3 |
| 2002/0099977 A1* | 7/2002 | Wong | G06F 11/261 |
| | | | 714/28 |
| 2003/0034798 A1* | 2/2003 | Leitch | G06F 15/7867 |
| | | | 326/39 |
| 2003/0115506 A1* | 6/2003 | Edwards | G06F 11/3636 |
| | | | 714/38.13 |
| 2003/0233601 A1* | 12/2003 | Vaid | G06F 11/3648 |
| | | | 714/42 |
| 2004/0221201 A1* | 11/2004 | Seroff | G06F 11/3636 |
| | | | 714/30 |
| 2005/0091629 A1* | 4/2005 | Eisenstadt | G06F 17/505 |
| | | | 326/81 |
| 2005/0248364 A1* | 11/2005 | Vadi | H03K 19/17732 |
| | | | 326/39 |
| 2008/0048716 A1* | 2/2008 | Balasubramanian | G06F 1/08 |
| | | | 326/38 |
| 2009/0146686 A1* | 6/2009 | Voogel | G06F 15/7867 |
| | | | 326/38 |
| 2015/0226795 A1* | 8/2015 | Hopkins | G01R 31/31705 |
| | | | 714/726 |

* cited by examiner

SYSTEM ON CHIP AND METHOD OF OPERATING A SYSTEM ON CHIP

CROSS REFERENCE TO RELATED APPLICATION(S)

The present application claims priority to Romanian Application No. RO A 2015 00671, entitled "SYSTEM ON CHIP AND METHOD OF OPERATING A SYSTEM ON CHIP," filed on Sep. 18, 2015, the entirety of which is herein incorporated by reference.

FIELD OF THE INVENTION

The present disclosure relates generally to a system on chip and a method of operating a system on chip. In particular, the present disclosure relates to chaining cross-trigger event information at the system on chip.

BACKGROUND

Today's systems on chip (SoCs) often comprise, as functional units or in addition to functional units, one or more observer units for detecting certain data processing events (referred to herein as the events of interest) on the SoC. For example, a bus observer unit can be connected to monitor a bus on the SoC for certain types of events and to generate a corresponding detection signal. Events to be detected by an observer unit can, for example, include certain transactions, requests, alerts, or repeated occurrences of such events. As another example, a display observer unit can be arranged to detect vsync symbols (e.g., in the form of voltage pulses) in a vertical synchronization (vsync) signal for controlling a video display.

An SoC may include quite a large number of observer units and these can be rather expensive. Typically, an observer unit is effective for a special purpose. However, an application executed by a processor core on the SoC, a profiling measurement, or a debugging operation may require combining several (i.e. two or more) events detected by one or more observer units or identifying a sequence of events. The way in which a combination or a sequence of events is defined may vary greatly from on SoC to another and may also be application-specific. Simultaneous events and/or a history of events can be evaluated by the one or more processor cores of the SoC, but this can consume valuable processing resources and also bring with it a delay (possibly several clock cycles) before the SoC can respond to a critical combination or history of events.

It would be desirable to save processing resources and power, by eliminating the need to use software for combining events or checking for a sequence of events; without losing the flexibility software provides to combine basically events from all observers within a SoC. Furthermore, it would be desirable to enable the SoC to respond rapidly, preferably with a delay of less than one or two clock cycles, to critical combinations of events, e.g., from several observer units, or to a certain sequence of events, e.g., event A detected by a first observer unit followed by event B detected by a second observer unit. It is understood that having such a capability enables a new set of applications that is not possible by involving software for combining or sequencing of corresponding events.

SUMMARY

The present invention provides a system on chip, SoC device, a method of operating the system on chip, SoC device as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION

Figure 1:
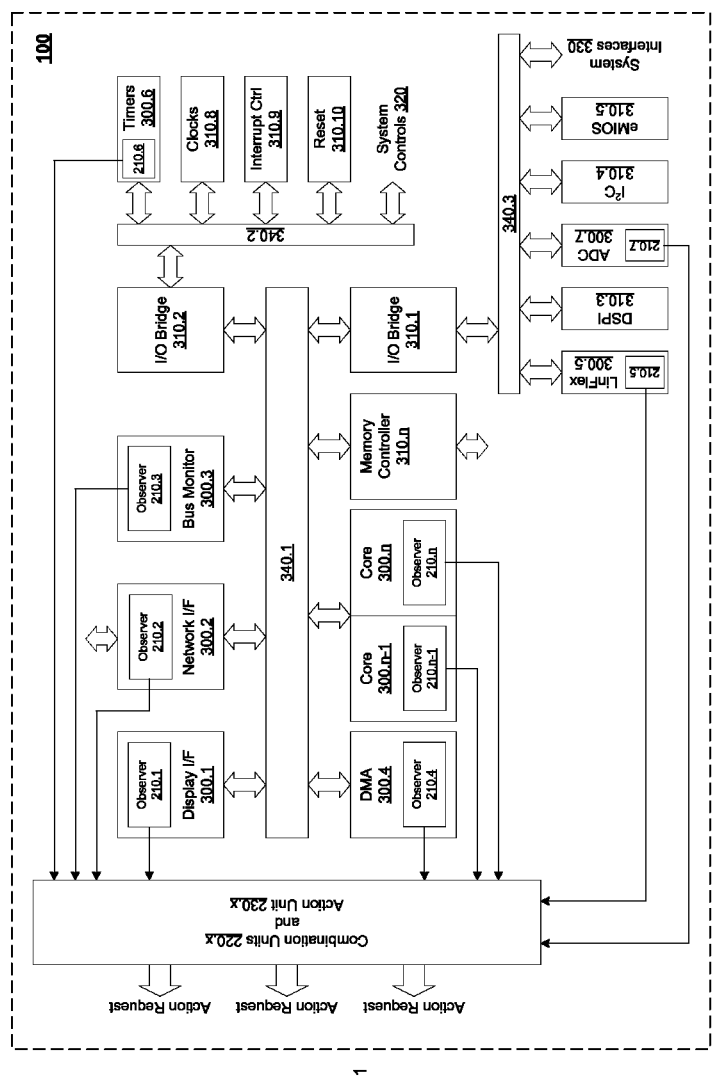
FIG. 1 schematically illustrates a block diagram of system-on-chip (SoC) device according to an example of the present invention.

Embodiments of the present disclosure will be described below in detail with reference to drawings. Note that the same reference numerals are used to represent identical or equivalent elements in figures, and the description thereof will not be repeated. The embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

In the example of FIG. 1, a schematic block diagram of a SoC (system-on-chip) device 100 is shown. The SoC device 100 is implemented on the basis of various interoperating functional units 300.$x$ and 310.$x$ including among others one or more processing cores 300.$n$–1 to 300.$n$. The plurality of functional units 300.$x$ and 310.$x$ may be implemented within the SoC device 100 on an integrated circuit (IC) or in a single package (denoted also as SiP: system-in-package).

In various examples, each of the plurality of functional units 300.$x$ and 310.$x$ may comprise hardware and/or software for performing one or more operations for the SoC device 100. The functional units 300.$x$ and 310.$x$ may be implemented, for example, by various logic devices such as a central processing unit (CPU), microcontroller, microprocessor, general purpose processor, dedicated processor, chip multiprocessor (CMP), media processor, digital signal processor (DSP), network processor, co-processor, input/output (I/O) processor, application specific integrated circuit (ASIC), field programmable gate array (FPGA), programmable logic device (PLD), and so forth. In various implementations, one or more of the functional units 300.$x$ and 310.$x$ may include one or more processing cores 300.$n$–1 to 300.$n$ arranged to execute digital logic and/or provide for multiple threads of execution.

The functional units 300.x and 310.x also may comprise memory implemented by one or more types of computer-readable storage media such as volatile or non-volatile memory, removable or non-removable memory, erasable or non-erasable memory, writeable or re-writeable memory, and so forth. In various embodiments, one or more of the functional units 3xx may include addressable memory locations in main memory, memory space, and/or registers implemented as random-access memory (RAM) and/or read-only memory (ROM), for example.

As shown in the example of FIG. 1, the plurality of functional units 300.x and 310.x of the example SoC device 100 comprises processing cores 300.n–1 and 300.n, a memory controller 310.n, a direct memory access unit 300.4, a display interface/controller 300.1, a network interface/controller 300.2, a bus monitor 300.3, an I/O bus bridge 310.2 for system control units such as one or more timers 300.6, one or more clock circuits 310.8, an interrupt controller 310.9, a rest unit 310.10, and an I/O bus bridge 310.1 for system interfaces such as a serial communication interface (such as LINflex, UART) 300.5, a deserial serial peripheral interface (DSPI) 310.3, an analog-to-digital converter (ADC) 300.7, an inter-integrated circuit (I$^2$C) interface 310.4, and an enhanced modular input/output subsystem (eMIOS) 310.5. The aforementioned exemplary functional units 300.x and 310.x are referred to and described for the sake of illustration only. The embodiments of the present application should not be understood as being limited thereto, in this context.

The processing cores 300.n–1, 300.n may be arranged to perform various operations such as initialization (e.g., boot) and issuing commands to manage or control processing, networking, multimedia, and/or communications applications for the SoC device 100. The processing cores 300.n–1, 300.n may be arranged, for example, to manage the manipulation of data (e.g., read, write, and erase) within the SOC device 100 to control such applications. The processing core 300.n–1, 300.n may comprise a microcontroller or other computing device arranged to execute logic implemented as software (e.g., operating system (OS) software, application software), code (e.g., boot code), and/or firmware.

The memory controller 310.n may be arranged to control the storage and retrieval of data from an off-chip DRAM such as Synchronous Dynamic RAM (SDRAM), Double-Data-Rate RAM (DDR RAM), DDR SDRAM, and so forth.

The one or more system interfaces and/or the network interface 300.2 may be arranged to receive data delivered to the SoC device 100 from an off-chip media source.

The display interface 300.1 may be arranged to perform various processing operations on data within the SoC device 100 for rending, displaying, and/or playing media content on a screen or other user interface (UI). The display interface 300.1 may comprise a graphics engine arranged to support 2D/3D graphics performance, multiple video textures, texture blending, and/or texture compression.

As illustrated in the embodiment of FIG. 1, the functional units 300.x and 310.x may be connected and/or logically coupled by one or more interconnect fabrics and/or buses 340.1, 340.2 and 340.3. The one or more interconnect fabrics and/or buses 340.x may be interconnected by data communication bridging units such as the illustrated I/O bridges 310.1 and 310.2. The interconnect fabrics and/or busses 340.x are provided to interconnect the functional units 300.x and 310.x within the SoC device 100 for data communication. The interconnect fabrics and/or busses 340.x may comprise conductive traces or lines for carrying signals such as address signals, data signals, and/or control signals. In an example, one or more of the functional units 300.x and 310.x may be arranged to operate as a master of a shared on-chip interconnect fabric or bus 340.x having the ability to read from and write data to any other functional unit 300.x and 310.x of the SoC device 100.

The interconnect fabrics and/or busses 340.x may be implemented, for example, as one of a Peripheral Component Interconnect (PCI) bus, PCI Extended (PCI-X) bus, PCI Express (PCIe) bus, XSI bus, CardBus, Advanced Microcontroller Bus Architecture (AMBA) including Advanced High-performance Bus (AHB) and Advanced Peripheral Bus (APB), or proprietary bus standards, like Freescale's IP Sky-Blue bus, and so forth. Although the interconnect fabrics and/or busses 340.x may be illustrated and described as comprising certain types and/or numbers of buses for ease of understanding, it may be appreciated that various interconnect architectures may be used for a given implementation. It also can be appreciated that, in some implementations, one or more functional units 300.x and 310.x may be arranged to communicate with each other by data and descriptor passing over direct connections.

Figure 2:
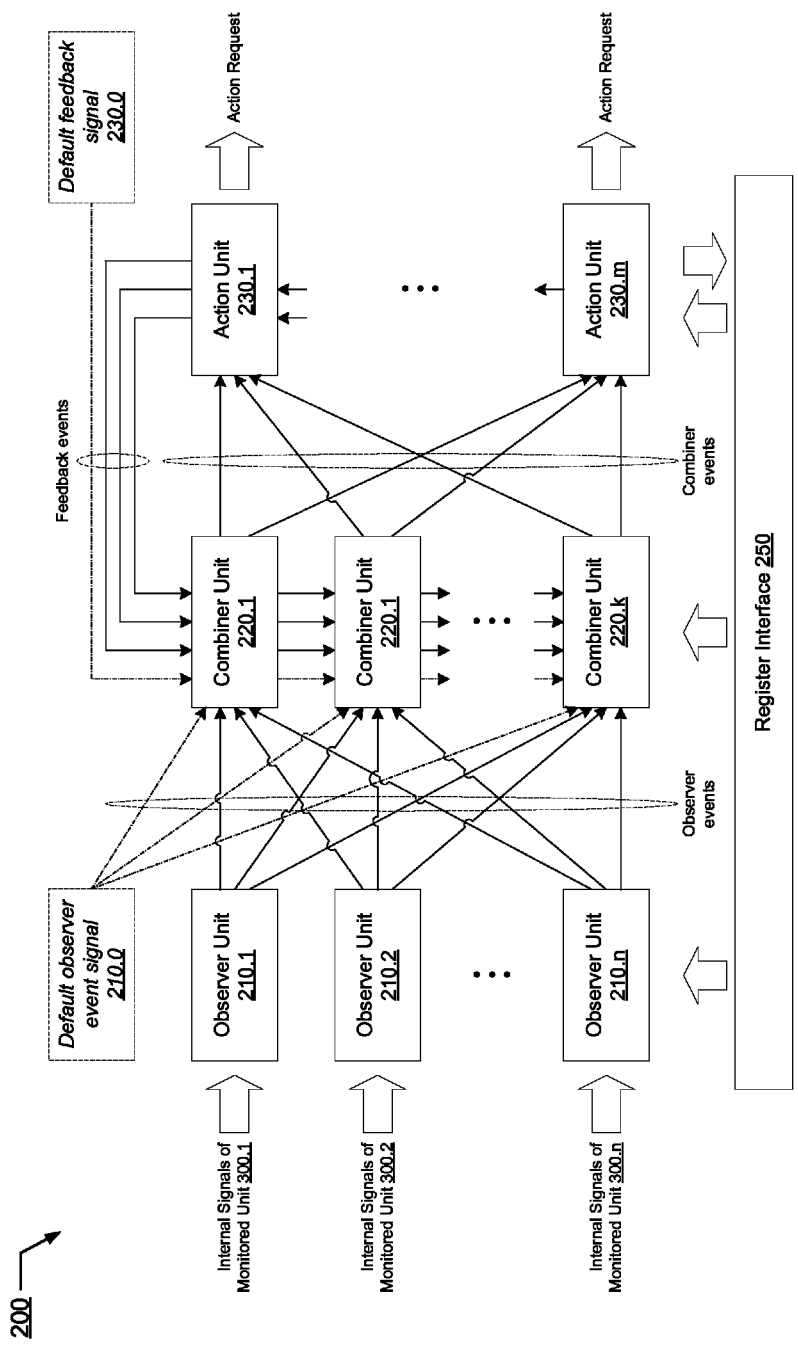
FIG. 2 schematically illustrates a block diagram of a distributed module for chaining cross-trigger information according to an example of the present invention.

The SoC device 100 comprises a module 200 for chaining cross-trigger information, which functionally comprises a set of observer units 210.1 to 210.n, where n is an integer and n≥2, a set of combiner units 220.1 to 220.k, where k is an integer and k≥1, and a set of action units 230.1 to 230.m, where m is an integer and m≥1. The module 200 for chaining cross-trigger information being part of the SoC device 100 is further schematically illustrated with reference to FIG. 2 and will be described in the following with reference to FIG. 2 and further in view FIG. 1. As understood from the following description, the units of the module 200 for chaining cross-trigger information may be distributed among different functional units 300.x of the SoC device 100.

Each of the observer units 210.1 to 210.n is provided to monitor one or more signal states of a respective one of the functional units 300.1 to 300.n of the SoC device 100. The functional units 300.x provided with a respective observer unit 210.x are also referred to herein as the monitored units 300.x or monitored functional units 300.x.

Every observer unit 210.x is associated with a respective monitored functional unit 300.x. In particular, an observer unit 210.x is connected or connectable to one or more signal lines, registers and/or memory elements of the respective functional unit 300.x. The one or more signal lines, registers and/or memory elements may be internal to the respective functional unit 300.x. In particular, an observer unit 210.x may be arranged in spacious proximity, included in and/or integrated with the respective functional unit 300.x.

The monitored units 300.x may comprise, herein for the sake of illustration only, the display interface 300.1, the network interface (e.g. Ethernet, WLAN, WWAN etc.) 300.2, the bus monitor 300.3, the direct memory access unit 300.4, the processing cores 300.n–1 and 300.n, the one or more timers 300.6, the serial communication interface (such as LINflex, UART) 300.5 and the analog-to-digital converter (ADC) 300.7. One observer unit 210.x is associated with every monitored functional unit 300.x. The observer unit 210.x may be specifically adapted to the monitored functional unit 300.x.

Every observer unit 210.x is arranged to generate an observer event signal indicative of a detection event that a monitored signal state of a respective functional unit 300.x (monitored by the observer unit 210.x) has a predefined state, assumes a predefined state or corresponds to a predefined state. Alternatively or additionally, every observer unit 210.x is arranged to generate an observer event signal indicative of a detection event that the monitored signal state of a respective functional unit $300.x$ undergoes a predefined state transition (e.g. the monitored state transitions from a first predefined state to a second predefined state). For instance, such an observer unit $210.x$ is arranged to detect events that may occur in the respective monitored functional unit $300.x$. The detection of an observer event relates to detecting a predefined state of the respective monitored functional unit $300.x$ or a predefined state transition of the monitored state of the respective monitored functional unit $300.x$. The predefined state and/or the predefined (state) transition are in particular individually configurable for each observer unit $210.x$. The observer unit $210.1$ to $201.n$ are configured through a register interface $250$ enabling write and/or read access to registers within the observer units $210.1$ to $201.n$. The registers are provided to maintain configuration settings including predefined states and/or the predefined (state) transitions.

It should be noted that the functional units $300.x$ comprising observer units $210.x$ as shown in FIG. 1 are merely exemplary and non-limiting. Different embodiments encompassed by the present application may have a different mixture of functional units and observer units associated therewith.

The observer event signals generated by the observer units $210.1$ to $210.n$ are supplied to every combiner unit $220.1$ to $220.k$ of the module $200$ for chaining cross-trigger information.

The combiner units $220.1$ to $220.k$ are arranged to receive the generated observer event signals and to generate the combinational event signal based on a controllable combinational connection of the one or more observer event signals and one or more feedback event signals.

The combinational event generated by a combiner unit $220.x$ is based on one or more observer event signals from a predefined subset of observer units $210.\{a\}$ (where $a=[a_0, \ldots, a_l]$, $1 \le a_i \le n$, $a_i \ne a_j$ for $i \ne j$, and $1 \le l \le n$). In particular, the predefined subset of observer units $210.\{a\}$ comprises at least two observer units $210.a_0, 210.a_1, \ldots$, which are controllably selected out of the plurality of observer units $210.1$ to $210.n$. The combinational event signal generated by a combiner unit $220.x$ is further based on none, one or more feedback event signals from a predefined subset of action units $230.\{b\}$ (where $b=[b_0, \ldots, b_q]$, $1 \le b_i \le m$, $b_i \ne b_j$ for $i \ne j$, and $1 \le q \le m$). In particular, the predefined subset of action units $230.\{b\}$ comprises at least one action unit $230.b_0$, which is controllably selected out of the plurality of action units $230.1$ to $230.m$.

The combinational event signals generated by each combiner unit $220.x$ are supplied to every one of the action units $230.1$ to $230.m$ of the module $200$ for chaining cross-trigger information.

The predefined subset of observer units $210.\{a\}$ and/or the predefined subset of action units $230.\{b\}$ are individually configurable for each combiner unit $220.x$. Further, the combinational connections are individually configurable for each combiner unit $220.x$.

The observer unit $210.1$ to $210.n$ are configured through a register interface $250$ enabling write and/or read access to registers within the observer units $210.1$ to $210.n$. The registers are provided to maintain configuration settings relating to the predefined subset of the observer units $210.\{a\}$, the predefined subset of action units $230.\{b\}$ and the combinational connection.

The action units $230.1$ to $230.m$ are arranged to receive the generated combinational event signals and to generate the feedback event signals and/or action requests.

The feedback event signal generated by an action unit $230.x$ is based on one or more combinational event signals from a predefined subset of combiner units $220.\{c\}$ (where $c=[c_0, \ldots, c_r]$, $1 \le c_i \le k$, $c_i \ne c_j$ for $i \ne j$, and $1 \le r \le k$). In particular, the predefined subset of combiner units $220.\{c\}$ comprises at least one combiner unit $220.c_0$ selected out of the plurality of combiner units $220.1$ to $220.k$. More particularly, an action unit $230.x$ is arranged to generate a feedback event signal on the basis of a combinational event signal received from one predefined combiner unit $220.x$ selected out of the plurality of combiner units $220.1$ to $220.k$.

The feedback event signals generated by each action unit $230.x$ are supplied to every one of the combiner units $220.1$ to $220.k$ of the module $200$ for chaining cross-trigger information.

The action request generated by an action unit $230.x$ is based on one or more combinational event signals from a predefined subset of combiner units $220.\{d\}$ (where $d=[d_0, \ldots, d_s]$, $1 \le d_i \le k$, $d_i \ne d_j$ for $i \ne j$, and $1 \le s \le k$). In particular, the predefined subset of combiner units $220.\{d\}$ comprises at least one combiner unit $220.d_0$ selected out of the plurality of combiner units $220.1$ to $220.k$. The predefined subset of combiner units $220.\{c\}$ may correspond to the predefined subset of combiner units $220.\{d\}$. More particularly, an action unit $230.x$ is arranged to generate an action request on the basis of a combinational event signal received from one predefined combiner unit $220.x$ selected out of the plurality of combiner units $220.1$ to $220.k$.

The action request may be a software request, which is supplied to the one or more processing cores $300.n-1$ and $300.n$. The software request is provided to trigger a predefined software activity by raising an interrupt or exception. The action request may also be a hardware request, which is supplied to one of the functional units $300.x$ and $310.x$ of the SoC device $100$ to trigger a predefined activity at the request receiving functional unit $300.x$ and $310.x$. A hardware request may be a reset request, which triggers a reset operation at the receiving functional unit $300.x$, $310.x$ or controlled by a reset control circuit (not shown), a DMA request (direct memory access) request, which initiates a direct memory access transaction at the DMA unit $300.4$, or a debug request, which initiates a debug operation under control of a debug module (not shown), or a request event specific for another functional hardware unit $300.x$ to perform an activity specific for this hardware unit.

In an example of the present application, the action units $230.1$ to $230.m$ are arranged to generate concurrently software requests, hardware requests or any combination of at least one software request and at least one hardware request.

Examples of different observer units $210.x$ as applicable with the module $200$ for chaining cross-trigger information implemented in the SoC device $100$ according to an example of the present application are further exemplified with respect to FIGS. $3a$ to $3e$ described below with reference thereto.

Referring now to FIG. $3a$, a block diagram of an observer unit $210.x$ according to an example of the present application is schematically illustrated. The observer unit $210.x$ comprises two functional blocks, which are a detector circuit or detector block $211.x$ and an event generator circuit or event generator block $212$.

The detector block $211.x$ is configured to monitor and/or snoop one or more signal states of lines, buses, registers and/or memories of the respective monitored functional unit $300.x$, in which the observer unit $210.x$ is included or in functional cooperation with which the observer unit $210.x$ is implemented. The one or more monitored states are further compared with one or more predefined states or state transitions by the detector block $211.x$ configured accordingly. In response to a monitored signal state corresponding to a predefined state or a detected transition of the monitored state corresponding to a predefined state transition, the detector block 211.*x* is arranged to signal the detection event to the event generator block 212, which in response thereto is arranged to generate an observer event signal based on the detection and the context thereof.

Those skilled the art will appreciate that the detector block 211.*x*, which is configured to non-intrusively monitor and/or snoop signal states of lines, buses, registers and/or memories of the monitored functional unit 300.*x* may be specifically adapted to the specific implementation and functionality of the functional unit 300.*x* to be monitored. Non-limiting examples of specifically adapted detector blocks 211.*x* will be described with reference to the following FIGS. 3*a* to 3*e* for the sake of a more fully understanding of the teaching of the present application.

The event generator block 212 is arranged to generate an observer event signal in response to a detection signal issued by the detector block 211.*x*. The observer event is in particular generated in accordance with a generic event format. The observer event signal generated by the event generator block 212 may comprise an event notification and/or data associated with the event in accordance with the generic event format. The event notification may comprise a logical value, such as a truth value, a bi-level value or a Boolean value. The associated data may comprise a multi-bit data value ($2^n$ bit value, wherein n is an integer and n>1). The associated data may comprise for instance a 32 bit value or a 64 bit value. The associated data may provide further information about or relating to the event; eventually configured by the register interface 250 or retrieved from the observed functional unit 300.*x* in accordance with configuration information provided by the register interface 250.

The associated data may comprise predefined data, an event identified relating to the individual event and/or a type of classification of the event, and/or data obtained from the detector block 211.*x* in the course of monitoring and/or snooping one or more signal states and/or in response to a detection.

Figure 3A:
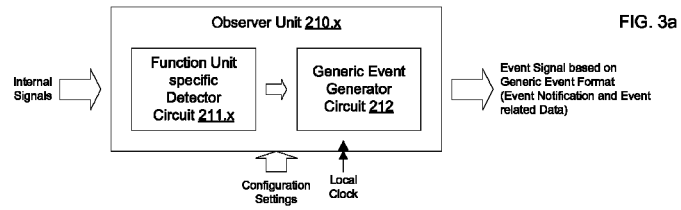
FIGS. 3a to 3e schematically illustrate block diagrams of observer units according to examples of the present invention.
Figure 3B:
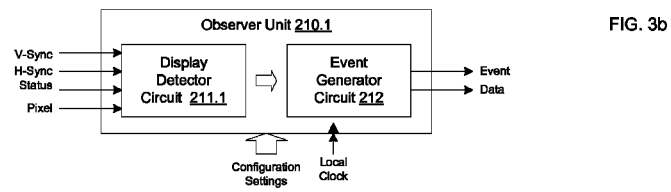

Referring now to FIG. 3*b*, a block diagram of another observer unit 210.1 according to an example of the present application is schematically illustrated. The observer unit 210.1 of FIG. 3*b* may be included in or implemented in functional cooperation with a display interface such as the display interface 300.1 of the exemplary SoC device 100 shown in FIG. 1.

The detector block 211.1 is specifically adapted and configured to monitor or snoop signal states of the output signals of the display interface 300.1. The monitored signals comprises in the illustrated example a V-Sync (vertical synchronization) signal, an H-Sync (horizontal synchronization) signal, a status signal and a pixel signal.

The detector block 211.1 is for instance arranged to monitor the V-Sync (vertical synchronization) signal and/or the H-Sync (horizontal synchronization) signal to verify that the synchronization signals are issued regularly within respective predefined time periods. The detector block 211.1 is for instance configured to signalize an occurrence or non-occurrence of the V-Sync (vertical synchronization) signal and/or the H-Sync (horizontal synchronization) signal within the respective repetition periods; dependent on configuration settings which may be provided by the register interface 250. In response to such an occurrence or non-occurrence signaling to the event generator block 212, an event signal is generated and issued by the observer unit 210.1.

For instance, the detector block 211.1 comprises one or more watchdog timers configurable with predefined time periods, which are newly started by one of the V-Sync (vertical synchronization) or H-Sync (horizontal synchronization) signals and which signal the lapse of time to the event generator block 212 arranged to generate corresponding event signals.

For another instance of such an observer, the detector block 211.1 may be arranged to monitor the pixel signal to verify that the pixel values change over time; e.g. within respective predefined time periods. The detector block 211.1 is for instance configured to signalize to the event generator block 212 once a predefined number of pixels have just one pixel value within respective predefined time periods. In response to such a signaling, the event generator block 212 is arranged to generate a corresponding event signal.

Figure 3C:
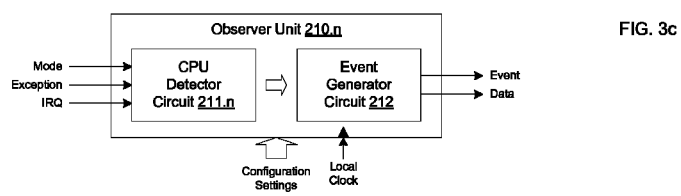

Referring now to FIG. 3*c*, a block diagram of another observer unit 210.*n* according to an example of the present application is schematically illustrated. The observer unit 210.*n* of FIG. 3*c* may be included in or implemented in functional cooperation with a processing unit or a processing core such as the processing core 300.*n* of the exemplary SoC device 100 shown in FIG. 1.

The detector block 211.*n* is specifically adapted and configured to monitor or snoop internal signal states of the processing core 300.*n*. The monitored signals comprises in the illustrated example a mode signal, an exception signal and an interrupt request (IRQ) signal.

For instance, the detector block 211.*n* may be arranged to monitor mode state (e.g. user/supervisor state, hypervisor protection states, or a task ID) of the processor core 300.*n* and compare the monitored mode state with one or more predefined mode states. The detector block 211.*n* is configured to signalize to the event generator block 212 once the processing core 300.*n* enters the predefined mode state. In response to detecting of the predefined mode state, the event generator block 212 is arranged to generate and issue a corresponding event signal.

For instance, the detector block 211.*n* may be arranged to monitor mode state of the processor core 300.*n* and detect a transition of the mode state from a first predefined mode state to a second predefined mode state (a predefined state transition). The detector block 211.*n* is configured to signalize to the event generator block 212 once the mode state of the processing core 300.*n* undergoes the predefined mode state transition. In response to detecting of the predefined mode state transition, the event generator block 212 is arranged to generate and issue a corresponding event signal.

For instance, the detector block 211.*n* may be arranged to monitor exceptions and/or IRQs (interrupt requests) occurring at the processor core 300.*n* and configured to signalize to the event generator block 212 a detected exception or IRQ. In response to detecting of an exception or an IRQ, the event generator block 212 is arranged to generate and issue a corresponding event signal.

Figure 3D:
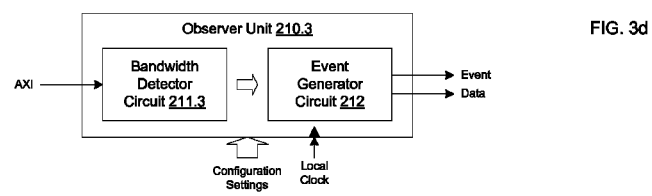

Referring now to FIG. 3*d*, a block diagram of another observer unit 210.3 according to an example of the present application is schematically illustrated. The observer unit 210.3 of FIG. 3*d* may be included in or implemented in functional cooperation with a bus monitor 300.3 coupled to an interconnect fabric or bus such as the bus 340.1 of the exemplary SoC device 100 shown in FIG. 1. For instance, the bus monitor 300.3 is implemented to interface with the Advanced Microcontroller Bus Architecture (AMBA) supporting the Advanced eXtensible Interface (AXI) protocol.

For instance, the detector block 211.3 is specifically adapted and configured to monitor status states of the bus 340.1 by snooping communication transactions at various channels of the bus 340.1. In particular, the detector block 211.3 may be arranged to measure a currently utilized bandwidth of the bus 304.1 and compare the measured utilized bandwidth with a predefined bandwidth threshold value. The detector block 211.3 is configured to signalize to the event generator block 212 once the measured utilized bandwidth exceeds the predefined threshold value. In response to signaling of an exceeding measured utilized bandwidth, the event generator block 212 is arranged to generate and issue a corresponding event signal. This is just exemplary for possible implementations of a bus observer unit 211.3; other properties of an interconnect or communication may be implemented similarly.

Figure 3E:
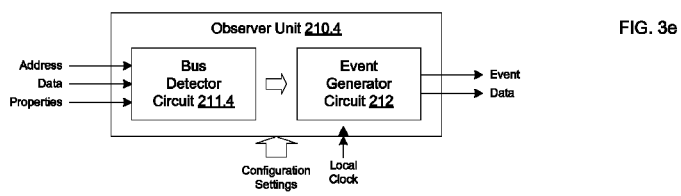

Referring now to FIG. 3e, a block diagram of another observer unit 210.4 according to an example of the present application is schematically illustrated. The observer unit 210.4 of FIG. 3e may be included in or implemented in functional cooperation with a direct memory access (DMA) unit such as the DMA unit 300.4 of the exemplary SoC device 100 shown in FIG. 1.

The detector block 211.4 is specifically adapted and configured to monitor or snoop DMA access related signal states of the DMA unit 300.4. The monitored signals comprises in the illustrated example an address signal, a data signal and a properties signal; e.g. a DMA request/response signal.

For instance, the detector block 211.4 may be arranged to detect a (read and/or write) access to a predefined address range, e.g. defined by a start address and end address, by monitoring address information issued by the DMA unit 300.4 e.g. on the bus 340.1 and comparing the monitored address information with the predefined address range. The detector block 211.4 is configured to signalize to the event generator block 212 in case the monitored address information is within the predefined address range. In response to signaling of a matching monitored address information, the event generator block 212 is arranged to generate and issue a corresponding event signal.

For instance, the detector block 211.4 is arranged to detect a data value by monitoring data information communicated with the DMA unit 300.4 e.g. on the bus 340.1 and comparing the monitored data information with a predefined data value. The detector block 211.4 is configured to signalize to the event generator block 212 in case the monitored data information corresponds to the predefined data value. In response to signaling of a detecting of the predefined data value, the event generator block 212 is arranged to generate and issue a corresponding event signal.

The above described address and data monitoring by the detector block 211.4 may be combined such that the event generator block 212 generates an event signal on detecting of a predefined data value associated with a predefined address or an address within a predefined address range.

The above examples of observer units 210.x should be understood as illustrative and non-limiting only. On the basis of the above examples, a skilled person understands that the detector circuit 211.x of an observer unit 210.x is specifically adapted to the functional unit 300.x to be monitored by the observer units 210.1 to 210.n. This means that the detector circuits 211.x of different observer units 210.1 to 210.n may differ from each other. The event generator circuits 212 of the observer units 210.x are each arranged to generate event signals in accordance with a common generic event format. Hence, the event generator circuits 212 of different observer units 210.x may substantially correspond to each other and especially generate common, generic events in accordance with a common generic event format.

Further, every observer unit 210.x is arranged in interoperable connection with the respective monitored functional unit 300.x. An observer unit 210.x is for instance included into, integrated with or arranged (in close proximity) with the respective monitored functional unit 300.x.

Further, the observer units 210.x may be arranged in the clocking domain of the respective monitored functional units 300.x. An observer unit 210.x and the respective monitored functional unit 300.x may receive the same local clock signal or may receive local clock signals derived from a common local clock signal. Each observer unit 210.x and the respective monitored functional unit 300.x are clocked by one or more local clock signals of the clocking domain of the respective monitored functional unit 300.x. One or more observer units 210.1 to 210.n (and the monitored functional units 300.x) may be operated asynchronously relative to each other.

Furthermore, the observer units 210.1 to 210.n may be arranged in the power domain of the respective monitored functional units 300.x. An observer unit 210.x and the respective monitored functional unit 300.x may receive a power signal from the same source. More particularly, the observer units 210.1 to 210.n may be arranged in the power management domain of the respective monitored functional units 300.x.

The observer units 210.1 to 210.n and in particular the detector blocks 211.x thereof are controllable and configurable through e.g. a register interface 250, which allows for accessing registers of the observer units 210.1 to 210.n. The detector blocks 211.x may comprises one or more registers for holding the one or more predefined states and/or predefined state transitions to be detected. It may also provide further information to be provided as data or as part of data associated with a detected event. The register interface 250 is provided to allow for writing and/or reading the registers with the one or more predefined states and/or predefined state transitions to be detected; it may further provide data associated with the last detected event.

The observer units 210.1 to 210.n and in particular the event generator blocks 212 thereof are controllable and configurable through e.g. a register interface 250. The event generator block 212 may comprise one or more registers for holding data associated with one or more event signals.

The registers of the observer units 210.1 to 210.n may be memory-mapped registers accessible through the register interface 250 by a software application executed at the SoC device 100.

Examples of different combiner units 220.x as applicable with the module 200 for chaining cross-trigger information implemented in the SoC device 100 according to an example of the present application are further exemplified with respect to FIGS. 4a to 4c described below with reference thereto. It should be noted that exemplary combiner units 220.x described below with reference to FIGS. 4a to 4c should not be considered as separate, independent or unrelated examples. Description of the functionality and/or components of one of the examples is transferable to the other ones, to which the description likewise applies.

Figure 4A:
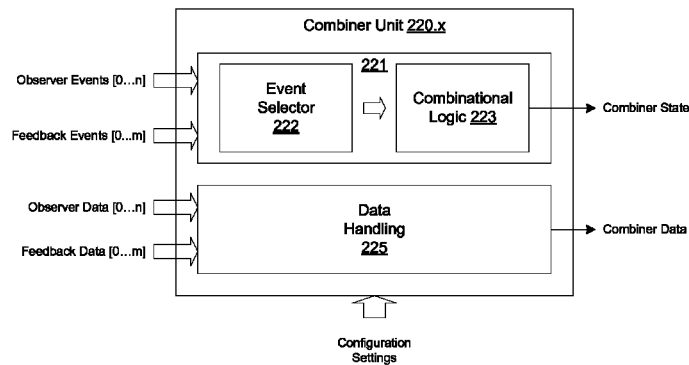
FIGS. 4a to 4c schematically illustrate block diagrams of observer units according to examples of the present invention.

Referring now to FIG. 4a, a block diagram of an example of a combiner unit 220.x of the module 200 chaining cross-trigger information is schematically illustrated. The illustrated example combiner unit 220.x may be considered representative of the plurality of combiner units 220.1 to 220.k comprised by the module 200 chaining cross-trigger information. In particular, the combiner units 220.1 to 220.k may be identical to one another.

Each of the combiner units 220.1 to 220.k is coupled to the observer units 210.1 to 210.n to receive the observer event signals generated thereat and to the action units 230.1 to 230.m to receive the feedback event signals supplied thereby.

The illustrated combiner unit 220.x comprises two sections: an event processing section 221 and a data handling section 225.

The event processing section 221 is arranged to generate a combinational event based on a controllable combinational connection of one or more observer event signals and one or more feedback events. The combinational event generated by the combiner unit 220.x is supplied to the action units 230.1 to 230.m of the module 200 chaining cross-trigger information. The event processing section 221 may further comprise an event selector block 222 and a combinational logic 223.

The event selector block 222 is coupled to the observer units 210.1 to 210.n and capable of receiving observer event signals therefrom. The event selector block 222 is further configured to selectively route observer event signals received from a predefined subset of observer units 210.{a} to respective inputs of the event processing section 221. The predefined subset of observer units 210.{a} is configurable to allow for processing observer event signals from a predefined selection of observer units 210.{a} out of the plurality of observer units 210.1 to 210.n at the event processing section 221. In an example of the present application, event selector block 222 is further configured to selectively route observer event signals received from a predefined subset including two observer units 210.{a} to respective inputs of the event processing section 221.

Further, the event selector block 222 is coupled to the action units 230.1 to 230.m and capable of receiving feedback event signals therefrom. The event selector block 222 is configured to selectively route feedback events received from a predefined subset of action units 230.{b} to respective inputs of the event processing section 221. The predefined subset of action units 230.{b} is configurable to allow for processing the events supplied by a predefined selection of action units 230.{b} out of the plurality of action units 230.1 to 230.m at the event processing section 221. In an example of the present application, event selector block 222 is further configured to selectively route a feedback event signal received from one predefined action unit 230.{b} to respective inputs of the event processing section 221.

The combinational logic 223 has a number of inputs corresponding to the number of units in the predefined subsets of observer units 210.{a} and action units 230.{b}. The combinational logic 223 is arranged to logically process event states available at the inputs thereof.

An event state encodes one of the presence and absence of an event. An event indicates a detection by an observer unit or a change of state within an action unit. Such an event is signalized by an event signal. The event signals may be communicated between the observer units, the combiner units and the action units using different protocols and/or media.

In particular, the combinational logic 223 is arranged to logically combine the predefined event states based on a predefined logical relationship to generate the output combinational event. The combinational logic 223 is controllable in accordance with a predefined logical relationship.

Hence, at the input of the combinational logic 223 event states are available, each of which may either represent the presence of a received event signal (from one out of the predefined subsets of observer units 210.{a} or actions unit 230.{b}) or the absence of any event signal. The event states present at a point in time at the inputs of the combinational logic 223 are logically combined by the combinational connection controllably operated in accordance with the predefined logical relationship.

The data handling section 225 is arranged to receive the data associated with the observer event signals from the observer units 210.1 to 210.n and data associated with feedback events from the action units 230.1 to 230.m. The data handling section 225 is configurable and arranged to output data selected from the associated data receivable from the predefined subset of observer units 210.{a} and the predefined subset of action units 230.{b} in response to detection events thereat. The data handling section 225 selectively routes one of the associated data to the output of the combiner unit 220.x to be outputted as data associated with a combinational event output by the combinational logic 223 to the action units 230.1 to 230.m of the module 200 chaining cross-trigger information.

The combiner units 220.1 to 220.k and in particular the event selector blocks 222, the combinational logics 233 and the data handling sections 225 thereof are controllable through e.g. the register interface 250. Each combiner units 220.1 to 220.k may comprise one or more registers for holding configuration settings for controlling the operation of the event selector block 222, the combinational logic 233 and the data handling section 225. The configuration settings may for instance comprise configuration settings about the selected units in the subsets of observer units 210{a} and action units 230.{b} for the event selector block 222 and the data handling section 225. The configuration settings may further comprise configuration settings for controlling the combinational connection in accordance with a predefined logical relationship. Each combiner unit 220.x may be controlled individually on the basis of individual configuration settings.

The registers of the combiner units 220.1 to 220.k may be memory-mapped registers accessible through the register interface 250 by a software application executed at the SoC device 100.

Figure 4B:
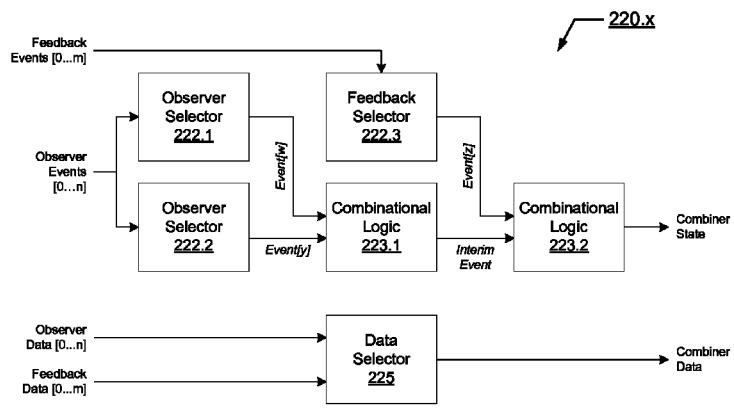

Referring now to FIG. 4b, a block diagram of another example of a combiner unit 220.x of the module 200 chaining cross-trigger information is schematically illustrated.

The illustrated combiner unit 220.x comprises observer selectors 222.1 and 222.2 and a feedback selector to 222.3, which relate to the aforementioned event selector 222, combinational logics 223.1 and 223.2, which relate to the aforementioned event processing section 221, and a data selector 225, which relates to the aforementioned data handling section 225.

Each of the observer selectors 222.1 and 222.2 is coupled at the input side to the plurality of observer units 210.1 to 210.n to allow for receiving observer event signals therefrom. Each of the observer selectors 222.1 and 222.2 is arranged to pass an event state relating to one predefined observer unit, e.g. the first observer selectors 222.1 is controllably arranged to pass the event state (denoted event[w]) relating to the observer unit 210.w, where $1 \leq w \leq n$, and the second observer selectors 222.2 is controllably arranged to pass the event state (denoted event[y]) relating to the observer unit 210.y, where $1 \leq y \leq n$, $y \neq w$.

The observer selectors 222.1 and 222.2 may be further arranged to selectively provide a default event state to the first combinational logic 223.1 instead of an event state relating to an observer unit. The default event state may be a predefined event state; always indicating one of the presence and absence of an event. The default event state may be configurable. The default event state may be supplied by a fixed or default signal observer unit 210.0. Hence, the first observer selector 222.1 is controllably arranged to pass the event state (denoted event [w]) relating to the observer unit 210.w, where $0 \leq w \leq n$, and the second observer selectors 222.2 is arranged controllably to pass the event state (denoted event[y]) relating to the observer unit 210.y, where $0 \leq y \leq n$, $y \neq w$.

The event states output by the event selectors 222.1 and 222.2 are supplied to the first combinational logic 223.1, which is controllably operated in accordance with a first predefined logical relationship.

The feedback selector 222.3 is coupled at the input side to the plurality of action units 230.1 to 230.m to allow for receiving feedback event signals therefrom. The feedback selector 222.3 is arranged to pass the event state relating to one action unit, e.g. the feedback selector 222.3 is controllably arranged to pass the event state (denoted event[z]) relating to the action unit 230.z, where $1 \leq z \leq m$.

The feedback selector 222.3 may be further arranged to selectively provide a default feedback event state to the second combinational logic 223.2 instead of an event state relating to an action unit. The default feedback event state may be a predefined default feedback event state; always indicating the presence or absence of an event. The default feedback event state may be configurable. The default feedback event state may be supplied by a supplied by a fixed or default signal action unit 230.0. Hence, the feedback selectors 222.3 is controllably arranged to pass the event state (denoted event[z]) relating to the action unit 230.z, where $1 \leq z \leq m$.

The event state output by the feedback selectors 222.3 is supplied to the second combinational logic 223.2, which is controllably operated in accordance with a second predefined logical relationship. Further, the interim result output by the first combinational logic 223.1 is also input to the second combinational logic 223.2.

The second combinational logic 223.2 outputs the combinational event state, which is a function of the event states of the two selected observer units 210.w and 210.y and further the one selected action unit 230.z. The combinatorial logics 223.1 and 223.2 are controllable to operate in accordance with the first and second predefined logical relationships forming a predefined logical relationship.

The data selector 225 is arranged to receive associated data from the observer units 210.1 to 210.n and the action units 230.1 to 230.m. The data selector 225 is further controlled to select one of the associated data received either from the observer unit 210.w, the observer unit 210.y or the action unit 230.z and output the selected associated data.

The combiner unit 220.x outputs a combinational events signal which comprises the combinational event state and/or the selected associated data to the action units 230.1 to 230.m. The combinational events signal may be generated in accordance with the aforementioned generic event format.

Figure 4C:
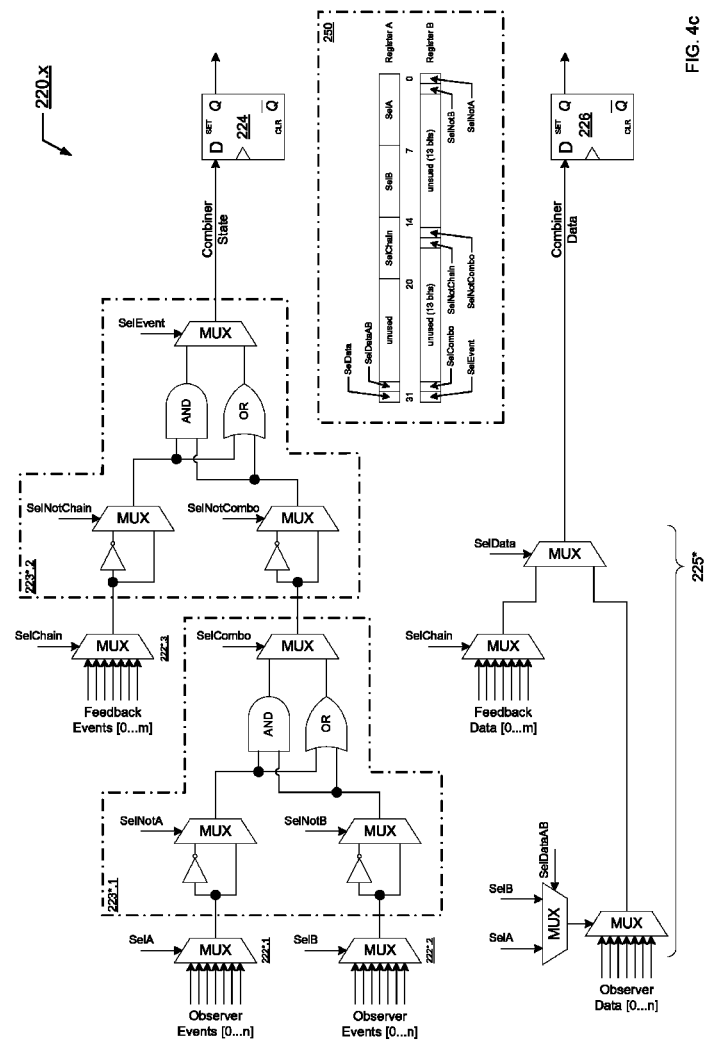

Referring now to FIG. 4c, a block diagram of a further example of a combiner unit 220.x of the module 200 chaining cross-trigger information is schematically illustrated. The example of FIG. 4c may be considered as one possible implementation of the examples described above with reference to FIGS. 4a and 4b.

In the example herein, the combiner unit 220.x is arranged for selecting a first event state relating to a first observer event signal receivable from a first observer unit 210.w out of the plurality of observer units 210.0 to 210.n (including the default event signal) and a second event state relating to a second observer event signal receivable from a second observer unit 210.y out of the plurality of observer units 210.0 to 210.n using two (n+1) multiplexer stages (MUX) 222*.1 and 222*.2 (corresponding to the event selectors 222.1 and 222.2). The two (n+1) multiplexer stages (MUX) 222*.1 and 222*.2 are controlled by the configurable select signals SelA and SelB, respectively.

The two first event states of the selected first and second observer units 210.w, 210.x are supplied to the first controllable combinational logic 223*.1 (corresponding to the first combinational logic 223.1). Each of the input event states can be selectively negated controlled by the negate control signals SelNotA and SelNotB, respectively. Further, the input event states can be selectively logically combined by a logical AND connection or a logical OR connection. The logical combination to be used is controllable by the combine control signal SelCombo. The first configurable combinational logic 223*.1 outputs an interim event state to the second configurable combinational logic 223*.2.

The combiner unit 220.x is further arranged for selecting a feedback event state relating to one action unit 230.z out of the plurality of action units 230.0 to 230.m (including the default feedback event signal) using an (m+1) multiplexer stage (MUX) 222*.3 (corresponding to the feedback selector 222.3). The (m+1) multiplexer stage 222*.3 is controlled by the configurable select signal SelChain.

The second configurable combinational logic 223*.2 has substantially the same set-up like the first configurable combinational logic 223*.1. The interim event state and the feedback event state input to the second configurable combinational logic 223*.2 can be selectively negated controlled by the negate control signals SelNotCombo and SelNotChain, respectively. Further, the input event states can be logically combined selectively by a logical AND connection or a logical OR connection. The logical combination to be used is controllable by the combine control signal SelEvent. The combiner unit 220.x is arranged to output a combinational event signal to the action units 230.1 to 230.m based on the generated combinational event state output by the second controllable combinational logic 223*.2

The combiner unit 220.x may further comprise a flip flop arrangement 224, which is arranged to temporarily register the generated combinational event state upstream of the second controllable combinational logic 223*.2.

The data handling section 225* of the exemplary combiner unit 220.x shown in FIG. 4c comprises an n×<size> multiplexer stage to select data having a size of <size> bits associated with an event from one of the first and second observer units 210.w, 210.y identified by the select signals SelA and SelB; which of these signals is used is itself selected by a further select signal SelDataAB and a m×<size> multiplexer stage to select data having a size of <size> bits associated with an event from the one action unit 230.z identified by the select signal SelChain. A select signal SelData allows further to control a 2×<size> multiplexer stage to select between observer data associated with one of the first and second observer units 210.w, 210.y (identified by either the select signal SelA or the select signal SelB, under control of the select signal SelDataAB) and the feedback data associated with the one action unit 230.z (identified by select signal SelChain). The combiner unit 220.x is arranged to output a combinational event signal to the action units 230.1 to 230.m associated with selected data output by the data handling section 225*.

The combiner unit 220.x may further comprise a flip flop arrangement 226, which is arranged to temporarily register the selected data upstream of the data handling section 225*.

The control signals including select signals SelA, SelB, SelChain, SelDataAB and SelData, negate control signals SelNotA, SelNotB, SelNotChain, and SelNotCombo, and combine control signals SelCombo and SelEvent may be held in one or more registers of the combiner unit 220.x, which are accessible through the register interface 250 for writing. For instance, the control signals may be held by a register A and a register B and the select signals SelA and SelB may be each a 7-bit signal (allowing for a maximum of 127 observer units, plus a default selection), the select signal SelChain may be a 6-bit signal (allowing for a maximum of 63 action units, plus a default selection), and the select signals SelDataAB and SelData, the negate control signals SelNotA, SelNotB, SelNotChain, and SelNotCombo, and combine control signals SelCombo and SelEvent may be each a 1-bit signal. All these signals may provide from one of the fields within the registers A and B provided as part of the register interface 250, as these are shown exemplary in FIG. 4c.

Those skilled in the art will immediately understand that the schematic block diagram of FIG. 4c illustrates a simplified block diagram reduced to operational elements for the sake of understanding of the present application. In particular, those skilled in the art understand the controllability of the event and data selectors as well as the combinational logic of the combiner unit 220.x according to an example of the present application.

Examples of different action units 230.x as applicable with the module 200 for chaining cross-trigger information implemented in the SoC device 100 according to an example of the present application are further exemplified with respect to FIGS. 5a to 5c described below with reference thereto. It should be noted that exemplary action units 230.x described below with reference to FIGS. 5a to 5c should not be considered as separate, independent or unrelated examples. Description of the functionality and/or components of one of the examples is transferable to the other ones, to which the description likewise applies.

Figure 5A:
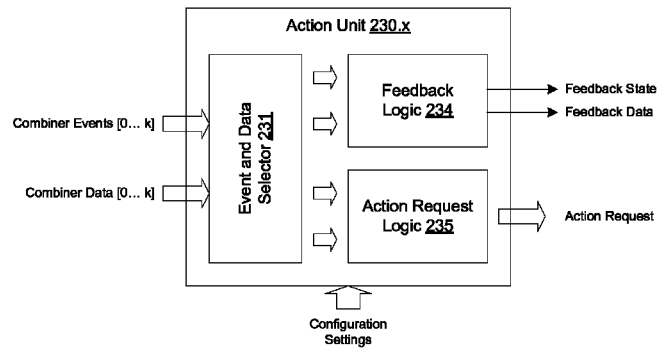
FIGS. 5a to 5c schematically illustrate block diagrams of action units according to examples of the present invention.

Referring now to FIG. 5a, a block diagram of an example of an action unit 230.x of the module 200 chaining cross-trigger information is schematically illustrated.

Each of the action units 230.1 to 230.m is coupled to the combiner units 220.1 to 220.m to receive the combinational event signals generated thereat. The illustrated action unit 230.x comprises an event and data selector 231, a feedback logic 234 and an action request logic 235.

The event and data selector 231 is coupled to the combiner units 220.1 to 220.k and capable of receiving combinational event signals therefrom. The event and data selector 231 is further configured to selectively pass combinational event signals received from a predefined subset of combiner units 220.{c} to respective inputs of the feedback logic 234 and the action request logic 235. The predefined subset of combiner units 220.{c} is configurable to allow for processing combiner event signals from a predefined selection of combiner units 220.{c} out of the plurality of combiner units 220.1 to 220.k at the feedback logic 234 and the action request logic 235. In an example of the present application, the event and data selector 231 is configured to selectively pass a combinational event signal received from one predefined combiner unit 220.{c} to respective inputs of the feedback logic 234 and the action request logic 235.

The feedback logic 234 is arranged to generate a feedback event signal based on a configurable feedback function based one or more combiner event signals routed by the event and data selector 231. The feedback event signal generated by the action unit 230.x is supplied to the combiner units 220.1 to 220.k as one of the 1 ... m feedback inputs within the module 200 chaining cross-trigger information.

The action request logic 235 is arranged to generate an action request based on a configurable request function based on one or more combiner event signals routed by the event and data selector 231. The action request signal generated by the action unit 230.x is supplied to one or more functional units 300.x 310.x of the SoC device 100.

The action units 230.1 to 230.m and in particular the event and data selector 231, the feedback logic 234 and the action request logic 235 thereof are configurable through e.g. the register interface 250. Each action units 230.1 to 230.m may comprise one or more registers for holding configuration settings for the event and data selector 231, the feedback logic 234 and the action request logic 235. The configuration settings may for instance comprise configuration settings about the selected units in the subsets of combiner units 220{c} for the event and data selector 231. The configuration settings may further comprise configuration settings for configuring the feedback function and/or the request function. Each action unit 230.x may be configured individually.

Furthermore, the register interface 250 may be arranged to enable read access to one or more registers of the action units 230.1 to 230.m. The one or more registers may registers holding configuration settings and processing data registers holding data obtained from and/or data derived from the received combinational events.

Figure 5B:
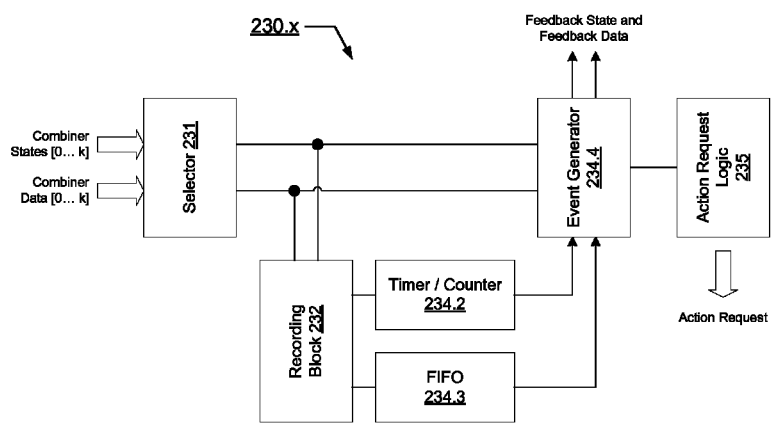

Referring now to FIG. 5b, a block diagram of a further example of an action unit 230.x of the module 200 chaining cross-trigger information is schematically illustrated. The example action unit 230.x of FIG. 5b comprises a selector block 231, a recording block 232, a timer/counter block 234.2, a buffer (FIFO) 234.3, an event generator block 234.4 and an action request generator 235.

The selector block 231 is an event and data selector block 231 to select combinational event signals received from a predefined subset of combiner units 220.{c}. At the recording block 232, the selected combinational event signals received from a predefined subset of combiner units 220.{c} are buffered. In an example of the present application, the selector block 231 is configured to selectively route a combinational event signal received from one predefined combiner unit 220.t to the recording block 232 for temporary buffering thereat. The recording block 232 is arranged to buffer the combinational event notification and/or the data associated with the combinational event. The recording block 232 is optional.

In an example of the present application, a further timer/counter block 234.2 is arranged to be operable as a timer. On receiving of a combinational event signal from the predefined subset of combiner units 220.{c}, the timer/counter block 234.2 controllably operated as timer is started. After lapse of a predefined time period, the timer/counter block 234.2 is arranged to issue a timer/counter event signal to the event generator block 234.4.

In an example of the present application, the timer/counter block 234.2 is arranged to be operable as a counter. A counter value of the timer/counter block 234.2 controllably operated as counter is incremented or decremented in response to a combinational event signal selected by the selector block 231 from the predefined subset of combiner units 220.{c}. On reaching a configurable predefined threshold value (e.g. exceeding and falling below the threshold value), the timer/counter block 234.2 is arranged to issue a timer/counter event signal to the event generator block 234.4.

In an example of the present application, the buffer 234.3 is provided to record and maintain combinational data of several combinational event signals received from the predefined subset of combiner units 220.{c}. The buffer 234.3 may be for instance a FIFO (first in first out) buffer. The buffer 234.3 is arranged to issue status events relating to the operation and/or state of the buffer 234.3. For instance, status events may be indicative of an empty buffer, a half filled buffer, an almost filled buffer (filled up to remainder of a predefined number of entries, e.g. full-1 or full-2), a filled buffer, read access, delete access, write access and the like. The buffer 234.3 is arranged to issue one or more status event signals to the event generator block 234.4. A predefined selection of status events reported to the event generator block 234.4 may be configurable.

The event generation block 234.4 is arranged to generate the feedback event signal on the basis of the received combinational event signal and/or further events signals as input to the combiner units 220.x.

In one example, the feedback event signal may a replication of the received combinational event signal or a stored or otherwise recorded instance of this event signal. In another example, the feedback event signal may be based on the timer/counter event signal received from the timer/counter block 234.2 upon lapse of time of the timer or on reaching a threshold value or the counter reaching a certain predefined limit. In a further example, the feedback event signal may be based on the status event signal received form the buffer 234.3. The event generator block 234.4 may be arranged to select one event signal out of the event signals supplied to it for generating the feedback event signal. The event signals to be selected may be controllable at the event generator block 234.4.

With reference to the exemplary action unit 230.x shown in FIG. 5a and described with reference thereto, a timer/counter block 234.2, a buffer (FIFO) 234.3 and an event generator block 234.4 may be considered as part of the configurable feedback logic 234.

The action request logic is arranged to generate an action request based on the received combinational event signal and/or further events signals input to the internal event generation block 234.4. In particular, the action request logic is arranged to generate an action request based on the event signal selected by the internal event generation block 234.4.

Figure 5C:
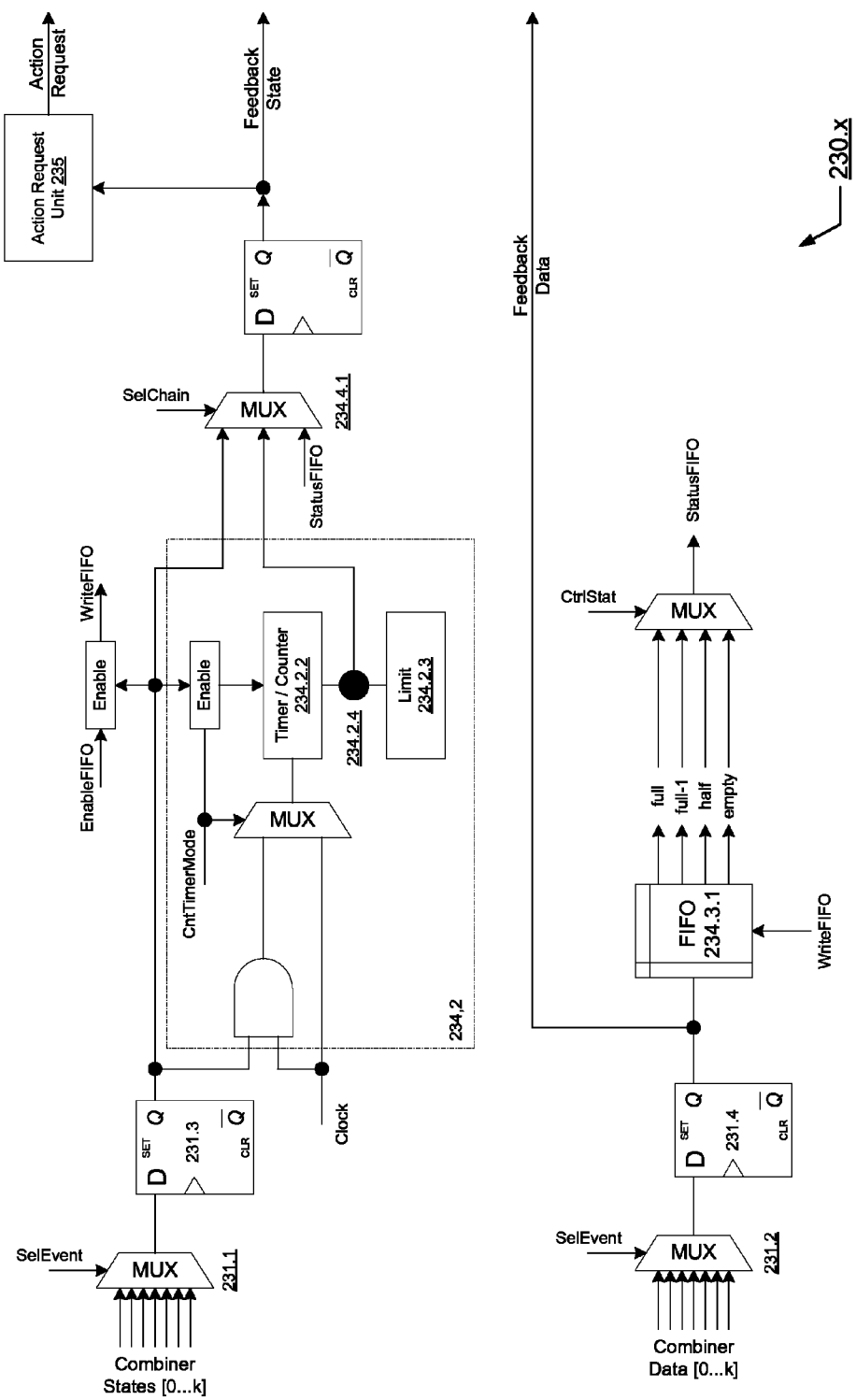

Referring now to FIG. 5c, a block diagram of a further example of an action unit 230.x of the module 200 chaining cross-trigger information is schematically illustrated. The example of FIG. 5c may be considered as one possible implementation of the examples described above with reference to FIGS. 5a and 5b, respectively.

In the example herein, the action unit 230.x is arranged for selecting a combinational event state relating to a combinational event signal received from one predefined combiner unit 220.x out of the plurality of combiner units 210.1 to 210.k using a (k+1) multiplexer stage (MUX) 231.1 (corresponding to the selector block 231). The (k+1) multiplexer 231.1 is controlled by the configurable select signal SelEvent.

The timer/counter block 234.2 is selectively operable as timer or counter using a configurable control signal CntTimerMode. In case the timer/counter block 234.2 is controlled by the control signal CntTimerMode to operate as timer, a clock signal having a predefined frequency is supplied to a counter register 234.2.2, which is arranged to count each clock cycle. In case the timer/counter block 234.2 is controlled by the control signal CntTimerMode to operate as counter, the combinational event state is supplied to the counter register 234.2.2, which is arranged to count in case an event is present.

A comparator 234.2.4 is arranged to compare the current value of the counter register 234.2.2 with a configurable threshold value or limit, which is for instance provided in a configurable limit register 234.2.3 and to issue a timer/counter event signal upon a match of both values.

At a multiplexer stage (MUX) 234.4.1, the feedback event state of the feedback event signal is selectable from at least one of the combinational event state, the timer/counter event signal and one or more status signal(s) issued by FIFO buffer 234.3.1. The multiplexer stage (MUX) 234.4.1 may be part of the event generator block 234.

In the example herein, the action unit 230.x is further arranged for selecting a combinational data relating to a combinational event signal received from one predefined combiner unit 220.x out of the plurality of combiner units 210.1 to 210.k using a (k+1)×<size> multiplexer stage (MUX) 231.2 (corresponding to the selector block 231). The (k+1)×<size> multiplexer 231.2 is controlled by the configurable select signal SelEvent. The combinational data (received from the selected predefined combiner unit 220.x) may be written into the FIFO buffer 234.3.1 in accordance with an enabling signal WriteFIFO based on a configurable enabling signal EnableFIFO and the combinational event state. One or more status event signal(s) relating to the operation and/or state of the FIFO buffer 234.3.1 are passed to the multiplexer stage (MUX) 234.4.1. In the example herein, a further multiplexer stage (MUX) 234.3.2 is provided to select one of the status events to be passed to the multiplexer stage (MUX) 234.4.1. The multiplexer stage (MUX) 234.3.2 is controlled by the configurable select signal CtrlStat.

The control signals including select signals SelEvent, SelChain and CtrlStat, the enabling signals CntTimerMode and EnableFIFO and the threshold value (limit register 234.2.3) may be held in one or more registers of the action unit 230.x, which are accessible through the register interface 250 for writing. Further registers holding data relating to the operation of the action unit 230.x such as the counter value of the timer/counter block 234.2 may be accessible via the register interface 250 for reading.

The action unit 230.x may further comprise a flip flop 231.3, which is arranged to temporarily buffer the selected combinational event state provided by the combiner unit 220.x.

The action unit 230.x may further comprise a flip flop arrangement 231.4, which is arranged to temporarily buffer the selected data provided by the combiner unit 220.x.

Those skilled in the art will immediately understand that the schematic block diagram of FIG. 5c illustrates a simplified block diagram reduced to operational elements for the sake of understanding of the present application. In particular, those skilled in the art understand the configurability and controllability of the action unit 230.x according to an example of the present application.

Those skilled in the art understand from the above description and examples that the SoC device 100 with module 200 for chaining cross-trigger information comprising may be understood to comprise an observer module, a combiner module, and an action module, the observer module including the one or more observer units 210.1 to 210.n, the combiner module including the one or more combiner units 220.1 to 220.k, and the action module including the one or more action units 230.1 to 230.m. The observer, combiner and action modules are scalable, that is, the number of observer units, combiner units and action units comprises by the respective modules is adaptable. Also, the actual functionality implemented by every instance of such a module is adaptable as well; e.g. only a certain amount of the m implemented action modules may implement a timer/counter sub-block. The observer unit 210.1 to 210.n may be distributed within the SoC device 100 along with the respective monitored functional units 300.x.

The observer units 210.1 to 210.n, the combiner units 220.1 to 220.k and the action units 230.1 to 230.m are individually configurable and controllable, e.g. via a register interface 250, which enables the individual configuration of one or more units of the observer units 210.1 to 210.n, the combiner units 220.1 to 220.k and the action units 230.1 to 230.m by a software application carried out on one or more of the processor cores of the SoC device 100.

Furthermore, the combiner units 220.1 to 220.k comprises in the module 200 for chaining cross-trigger information may have an identical set-up. The number of combiner units 220.1 to 220.k comprised in the module 200 for chaining cross-trigger information can be increased to allow for more complex combinational algorithms for combining observer events.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To illustrate clearly this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The operations and functionalities described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Those skilled in the art will recognize that the boundaries between the illustrated logic blocks and/or functional elements are merely illustrative and that alternative embodiments may merge blocks or elements or impose an alternate decomposition of functionality upon various blocks or elements. Thus, it is to be understood that the architectures depicted herein are merely exemplary, and that in fact many other architectures can be implemented which achieve the same functionality.

Any arrangement of components to achieve the same functionality is effectively associated such that the desired functionality is achieved. Hence, any two components herein combined to achieve a particular functionality can be seen as associated with each other such that the desired functionality is achieved, irrespective of architectures or intermedial components. Likewise, any two components so associated can also be viewed as being operably connected, or operably coupled, to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to distinguish arbitrarily between the elements such terms describe. Thus, these terms are not necessarily intended to indicate temporal or other prioritization of such elements. The mere fact that certain measures are recited in mutually different claims does not indicate that a combination of these measures cannot be used to advantage.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

The invention claimed is:

1. A system on chip, SoC, comprising:
    two or more observer units,
    one or more combiner units, each of which is coupled to the two or more observer units to receive one or more observer events from them,
    one or more action units, each of which is coupled to the one or more combiner units to receive one or more combinational events from them, to supply one or more feedback events to them and to output one or more action requests,
    wherein each of the two or more observer units is arranged
        to monitor a state of a respective functional unit of the SoC,
        to generate the observer event indicative of a detection of a monitored state having a configurable predefined state or a configurable predefined transition to the monitored state, and
        to supply the generated observer event to the one or more combiner units;
    wherein each of the one or more combiner units is arranged
        to generate the combinational event based on a controllable combinational connection of the one or more observer events from a configurable predefined set of observer units and the one or more feedback events from a configurable predefined set of action units, and
        to supply the generated combinational event to the one or more action units;
    wherein each of the one or more action units is arranged to generate at least one of
        the feedback event based on the at least one combinational event received from the one or more combiner units in accordance with a configurable feedback function,
        the action request based the on at least one combinational event received from the one or more combiner units in accordance with a configurable request function.

2. The system on chip, SoC, according to claim 1,
    wherein the action request comprises a software request, which triggers a predefined software activity by raising an interrupt request or an exception.

3. The system on chip, SoC, according to claim 1,
    wherein the action request comprises a hardware request to a functional unit of the SoC, wherein the request comprises at least one of a reset request, direct memory access request, debug request.

4. The system on chip, SoC, according to claim 1,
    wherein the one or more action units are arranged to generate concurrently any combination of at least one software request and at least one hardware request.

5. The system on chip, SoC, according to claim 1,
    wherein each one of the two or more observer units comprises a monitoring block,
    wherein each of the monitoring blocks is specifically adapted to the respective functional unit to be monitored.

6. The system on chip, SoC, according to claim 1,
    wherein each one of the two or more observer units comprises an event generation block, which is arranged to generate the observer event,
    wherein the observer events generated by the two or more observer units have a generic event format.

7. The system on chip, SoC, according to claim 1, further comprising:
    a register interface coupled to the one or more combiner units and arranged to configure the configurable predefined state and the configurable predefined transition of the one or more combiner units.

8. The system on chip, SoC, according to claim 1,
    wherein the observer events, the combinational events, and the feedback events have a generic event format, which comprises
        a notification and
        data associated with the event,
    where the associated data comprises additional information and is encoded in form of a $2^n$ bit value, wherein n is an integer and n>1.

9. The system on chip, SoC, according to claim 8,
    wherein the notification represents a logical value, a signal handshake or change of state within a period of time.

10. The system on chip, SoC, according to claim 1,
    wherein the one or more action units comprise
        a storage element to record a received combinational event to provide the stored event as feedback event.

11. The system on chip, SoC, according to claim 1,
    wherein the one or more action units further comprise
        a counter element arranged to count the received combinational events from one of the one or more combiner units and to generate a feedback event and/or action request in response to the counter having a configurable predefined counter value.

12. The system on chip, SoC, according to claim 1,
    wherein the one or more action units further comprise
        a timer element arranged to start time measuring once a combinational event is received from one of the one or more combiner units and to generate a feedback event and/or action request once a configurable predefined time period is lapsed.

13. The system on chip, SoC, according to claim 1,
    wherein the one or more action units further comprise
        a storage element to record data associated with one or more received combinational events,
    wherein at least one of a feedback event and an action request is generated on the basis of the internal state change inside the storage element.

14. The system on chip, SoC, according to claim 1,
    wherein each of the each of the one or more combiner units comprises a first selecting element arranged to receive observer events from one selected observer unit;
a second selecting element arranged to receive observer events from another selected observer unit;
a third selecting element arranged to receive action events from one selected feedback unit;
wherein the combinational connection of each of the one or more combiner units is controllably arranged
to generate an intermediate combinational event based on observer events received from the selected observer units in accordance with a first predefined combinational function; and
to generate the combinational event based on the intermediate combinational event and a feedback event received from the selected feedback unit in accordance with a second predefined combinational function.

15. The system on chip, SoC, according to claim 14, wherein every input of the combinational connection is arranged to provide an event state representing one of the presence of a received event and the absence of such an event.

16. The system on chip, SoC, according to claim 15, wherein the first and second combinational function is configurable to implement at least one of the following operations:
selecting a single event from the two input events;
creating an event when the both input events are present; and
creating an event when at least one of the two input events is present.

17. The system on chip, SoC, according to claim 14, wherein the selecting elements and the combinational connection of the one or more combiner units are controllable via a register interface.

18. The system on chip, SoC, according to claim 1, wherein the observer events and the feedback events comprise associated data,
wherein the one or more combiner units are further arranged
to receive the associated data, and
to controllably select the associated data of one of the received events;
wherein the combinational event comprises the selected associated data.

19. The system on chip, SoC, according to claim 1, further comprising:
a register interface, which is coupled to the two or more observer units, the one or more combiner units, and the one or more action units,
wherein the register interface is arranged to provide configuration settings to configure and to control at least one of the connected units.

20. A method of operating a system on chip, SoC, device, wherein the SoC device comprises
two or more observer units;
one or more combiner units, each of which is coupled to the two or more observer units to receive one or more observer events from them; and
one or more action units, each of which is coupled to the one or more combiner units to receive one or more combinational events from them, to supply one or more feedback events to them and to output one or more action requests,
wherein the method comprises
at the observer units:
monitoring a state of a respective functional unit of the SoC; generating the observer event indicative of a detection of a monitored state having a configurable predefined state or a configurable predefined transition to the monitored state, and supplying the generated observer event to the one or more combiner units;
at the combiner units:
generating the combinational event based on a controllable combinational connection of the one or more observer events from a configurable predefined set of observer units and the one or more feedback events from a configurable predefined set of action units, and supplying the generated combinational event to the one or more action units;
at the action units:
generating at least one of the feedback event based on the at least one combinational event received from the one or more combiner units in accordance with a configurable feedback function, and the action request based the on at least one combinational event received from the one or more combiner units in accordance with a configurable request function.

* * * * *